(12) United States Patent
Ikehata et al.

(10) Patent No.: US 8,912,427 B2
(45) Date of Patent: Dec. 16, 2014

(54) POLYESTER FILM FOR SEALING BACKSIDE OF SOLAR CELL

(75) Inventors: Yoshitomo Ikehata, Tsuruga (JP); Akira Shimizu, Tsuruga (JP); Shiro Hamamoto, Tsuruga (JP); Jun Inagaki, Tsuruga (JP); Shinji Sawazaki, Osaka (JP)

(73) Assignee: Toyobo Co., Ltd., Osaka (JP)

( * ) Notice: Subject to any disclaimer, the term of this patent is extended or adjusted under 35 U.S.C. 154(b) by 94 days.

(21) Appl. No.: 13/809,360

(22) PCT Filed: Jul. 13, 2011

(86) PCT No.: PCT/JP2011/065980
§ 371 (c)(1),
(2), (4) Date: Jan. 9, 2013

(87) PCT Pub. No.: WO2012/008488
PCT Pub. Date: Jan. 19, 2012

(65) Prior Publication Data
US 2013/0112271 A1 May 9, 2013

(30) Foreign Application Priority Data

Jul. 14, 2010 (JP) .................................. 2010-159712
Jul. 14, 2010 (JP) .................................. 2010-159713
Jul. 14, 2010 (JP) .................................. 2010-159714

(51) Int. Cl.
| | | |
|---|---|---|
| *H01L 31/042* | (2014.01) | |
| *H02N 6/00* | (2006.01) | |
| *D01F 1/02* | (2006.01) | |
| *B32B 27/06* | (2006.01) | |
| *H01L 31/048* | (2014.01) | |
| *B32B 27/08* | (2006.01) | |
| *B32B 27/20* | (2006.01) | |
| *B32B 27/36* | (2006.01) | |
| *C08J 5/18* | (2006.01) | |
| *H01L 31/052* | (2014.01) | |

(52) U.S. Cl.
CPC ............ *H01L 31/0487* (2013.01); *B32B 27/08* (2013.01); *B32B 27/20* (2013.01); *B32B 27/36* (2013.01); *C08J 5/18* (2013.01); *H01L 31/0527* (2013.01); *C08J 2367/02* (2013.01); *Y02E 10/52* (2013.01)
USPC ............................ 136/251; 264/211; 428/480

(58) Field of Classification Search
None
See application file for complete search history.

(56) References Cited

U.S. PATENT DOCUMENTS

| | | | | |
|---|---|---|---|---|
| 8,609,255 | B2 * | 12/2013 | Aoyama et al. ............... | 428/480 |
| 2006/0263592 | A1 * | 11/2006 | Kusume et al. ............... | 428/327 |
| 2009/0126970 | A1 * | 5/2009 | Sasaki et al. ............ | 174/110 SR |
| 2010/0086736 | A1 * | 4/2010 | Ueda et al. ..................... | 428/141 |
| 2010/0229924 | A1 * | 9/2010 | Teranishi et al. ............. | 136/252 |
| 2010/0229945 | A1 * | 9/2010 | Suzuta et al. ................. | 136/259 |

FOREIGN PATENT DOCUMENTS

| | | | |
|---|---|---|---|
| JP | 02-158633 | A | 6/1990 |
| JP | 11-261085 | A | 9/1999 |
| JP | 2000-114565 | A | 4/2000 |
| JP | 2002-134771 | A | 5/2002 |
| JP | 2004-247390 | A | 9/2004 |
| JP | 2006-253264 | A | 9/2006 |
| JP | 2007-204538 | A | 8/2007 |
| JP | 2007-208179 | A | 8/2007 |
| JP | 2007204538 | A * | 8/2007 |
| JP | 2008-004691 | A | 1/2008 |
| JP | 2008-004839 | A | 1/2008 |
| JP | 2008-030459 | A | 2/2008 |
| JP | 2008-085270 | A | 4/2008 |
| JP | 2008-166338 | A | 7/2008 |
| JP | 2008-270238 | A | 11/2008 |
| JP | 2009-202587 | A | 9/2009 |
| WO | WO 2007/122936 | A1 | 11/2007 |
| WO | WO 2007122936 | A1 * | 11/2007 |
| WO | WO 2007148754 | A1 * | 12/2007 |
| WO | WO 2008093623 | A1 * | 8/2008 |

OTHER PUBLICATIONS

International Bureau of WIPO, International Preliminary Report on Patentability in International Patent Application No. PCT/JP2011/065980 (Feb. 21, 2013).
Japanese Patent Office, International Search Report in International Patent Application No. PCT/JP2011/065980 (Oct. 25, 2011).

* cited by examiner

*Primary Examiner* — Eli Mekhlin
(74) *Attorney, Agent, or Firm* — Leydig, Voit & Mayer, Ltd.

(57) ABSTRACT

The present invention provides a polyester film for sealing the backside of solar cell having excellent light reflectivity and durability and good electric insulation. A polyester film for sealing the backside of solar cell having a light reflectance at 550 nm wavelength of 50% or more and containing 3 to 50% by mass of inorganic fine particles, characterized in that acid value of the film is 1 to 30 eq/ton and limiting viscosity of the film is 0.60 to 0.80 dL/g.

14 Claims, No Drawings

US 8,912,427 B2

POLYESTER FILM FOR SEALING BACKSIDE OF SOLAR CELL

CROSS-REFERENCE TO RELATED APPLICATIONS

This patent application is the U.S. national phase of International Patent Application No. PCT/JP2011/065980, filed on Jun. 23, 2011, which claims the benefit of Japanese Patent Application No. 2010-159712, filed on Jul. 14, 2010, Japanese Patent Application No. 2010-159713, filed on Jul. 14, 2010, and Japanese Patent Application No. 2010-159714, filed on Jul. 14, 2010, which are incorporated by reference in their entireties herein.

TECHNICAL FIELD OF THE INVENTION

The present invention relates to a polyester film for sealing the backside of solar cell having excellent light reflectivity and durability and good electric insulation.

BACKGROUND ART

Recently, solar cells are receiving public attention as a clean energy source of the next generation. In a solar cell module, a component such as a sheet for sealing the backside of solar cell which seals the backside of solar cell module is used and a substrate film is used for the component as such. Since a solar cell used in outside is used for a long period of time, the component therefor is to be also durable under natural environment. As to the component such as a substrate film for sealing the backside of solar cell, there is used fluorine film, polyethylene film or polyester film (cf. Patent Documents 1 and 2). As to a sheet for sealing the backside of solar cell, there is proposed a white sheet for sealing the backside of solar cell in order to enhance the photoelectric conversion efficiency of the solar cell device (cf. Patent Documents 3 to 7).

Further, for improving the properties of the solar cell system as a whole, there has been a strong demand for setting the system voltage high. Therefore, there has been an increasing demand for the electric insulation property to the sheet for sealing the backside of solar cell and there have been proposals for a sheet for sealing the backside of solar cell compatible with the system voltage of 1,000 V (cf. Patent Documents 8 and 9).

Furthermore, as mentioned in the above Patent Documents, a polyester film of high whiteness degree has been used for reflecting the sunlight and for enhancing the generation efficiency by the solar cell device. In order to prepare a polyester film of high whiteness degree, it is necessary to add a lot of particles to the polyester substrate. At that time, many thermal hystereses are added due to the fact that a raw material where two or more materials are preliminarily mixed or that melting time is made long even in the usual extruding step so as to make the dispersibility and mixing state thereof good. Therefore, the polyester resin is hydrolyzed and is apt to be deteriorated whereby there has been a problem of poor durability when it is used under high temperature and humidity. Accordingly, it has been common up to now that, as mentioned in the Patent Document 7, a white layer and a layer having durability are prepared as separate functional layers followed by laminating them and it has been difficult to satisfy both high reflectivity and durability by a single layer.

Still further, in recent years, the mode for use of solar cell is developing from just placing on a roof to a large-scale photovoltanic generator in desert regions, etc. and a solar cell module has been becoming to large size and high output of power. At that time, many solar cell devices are aligned in a sheet of solar cell module. When unbalanced generation characteristic happens for each of the solar cell devices, load is focused to a solar cell device having low generation characteristic whereby the temperature of such a solar cell device part becomes particularly high. In a solar cell module where such a hot spot is resulted, the material around the hot spot is exposed to high temperature and, as a result, that causes deterioration of the resin such as sealing resin or backside protecting membrane or inferiority such as detachment.

PRIOR ART DOCUMENTS

Patent Documents

Patent Document 1: Japanese Patent Application Laid-Open (JP-A) No. 261085/99
Patent Document 2: Japanese Patent Application Laid-Open (JP-A) No. 2000-114565
Patent Document 3: Japanese Patent Application Laid-Open (JP-A) No. 2004-247390
Patent Document 4: Japanese Patent Application Laid-Open (JP-A) No. 2002-134771
Patent Document 5: Japanese Patent Application Laid-Open (JP-A) No. 2007-208179
Patent Document 6: Japanese Patent Application Laid-Open (JP-A) No. 2008-85270
Patent Document 7: Japanese Patent Application Laid-Open (JP-A) No. 2008-4839
Patent Document 8: Japanese Patent Application Laid-Open (JP-A) No. 2006-253264
Patent Document 9: Japanese Patent Application Laid-Open (JP-A) No. 2008-166338

DISCLOSURE OF THE INVENTION

Problem that the Invention is to Solve

The present invention has been created in view of the above problems in the prior art and its object is to provide a polyester film for sealing the backside of solar cell having both high reflectivity and durability and achieving excellent electric insulation. Further object of the present invention is to provide a polyester film for sealing the backside of solar cell which contributes in uniform generating characteristic in the module.

Means for Solving the Problem

The present inventors have conducted intensive investigation for achieving the above objects and, as a result, they have found that both whiteness degree and resistance to hydrolysis can be made compatible with each other when acid value and limiting viscosity of the film are controlled within a specific range whereupon the present invention has been accomplished.

Thus, the present invention adopts the constitutions of the following (1) to (10):

(1) A polyester film for sealing the backside of solar cell having a light reflectance at 550 nm wavelength of 50% or more and containing 3 to 50% by mass of inorganic fine particles, characterized in that acid value of the film is 1 to 30 eq/ton and limiting viscosity of the film is 0.60 to 0.80 dL/g.

(2) The polyester film for sealing the backside of solar cell according to (1), wherein in-face variation of the light reflectance to the mean value of the light reflectance is 5% or less.

(3) The polyester film for sealing the backside of solar cell according to (1) or (2), wherein the inorganic fine particles are titanium oxide of a rutile type.

(4) The polyester film for sealing the backside of solar cell according to any of (1) to (3), wherein the thickness is 30 to 300 μm.

(5) The polyester film for sealing the backside of solar cell according to any of (1) to (4), wherein the partial discharge voltage is 550 V or higher.

(6) The polyester film for sealing the backside of solar cell according to any of (1) to (5), wherein the layered numbers of cavities existing in the thickness direction of the film is 5 or more and the density of layered numbers of cavities defined by the following formula is within a range of 0.1 to 7/μm:

Density of layered numbers of cavities(numbers/μm)= [Layered numbers of cavities in the thickness direction of film]/[Thickness of film(μm)]

(7) The polyester film for sealing the backside of solar cell according to any of (1) to (6), wherein an applied layer is provided at least on one side of the film and a urethane resin where an aliphatic polycarbonate polyol is a constituting component is a main component of the applied layer.

(8) The polyester film for sealing the backside of solar cell according to any of (1) to (7), wherein the film is used on the face of a side contacting an encapsulation foil for a solar cell module and/or on the outermost face of a solar cell module.

(9) The polyester film for sealing the backside of solar cell according to any of (1) to (8), wherein the film is obtained by preparing a master batch comprising a polyester resin and inorganic fine particles; subjecting the master batch to solid-phase polymerization and; after that, pouring a polyester resin containing no inorganic fine particles and the master batch into an extruder and melt extruding the mixture.

(10) A solar cell module which is characterized in containing the polyester film for sealing the backside of solar cell mentioned in any of (1) to (8), an encapsulation foil layer being adjacent to the polyester film and a solar cell device embedded in the encapsulation foil layer.

Advantages of the Invention

The polyester film for sealing the backside of solar cell of the present invention has both high light reflectivity and durability. Moreover, even when it is thin, the film has good electric insulation and also has uniform light reflectivity characteristic in a module. Accordingly, when the polyester film for sealing the backside of solar cell of the present invention is used, a solar cell module having excellent durability, low cost and light weight can be provided.

BEST MODE FOR CARRYING OUT THE INVENTION

The polyester used for the film of the present invention is a polyester produced by polycondensation of an aromatic dicarboxylic acid such as terephthalic acid, isophthalic acid or naphthalenedicarboxylic acid or an ester thereof with a glycol such as ethylene glycol, diethylene glycol, 1,4-butanediol or neopentyl glycol. Instead of a method by a direction reaction of aromatic dicarboxylic acid with glycol, the polyester can be produced by a method where polycondensation is conducted after an ester interchange of alkyl ester of aromatic dicarboxylic acid with glycol, by a method where diglycol ester of aromatic dicarboxylic acid is subjected to polycondensation, etc. Typical examples of the polyester as such include polyethylene terephthalate, polyethylene butylene terephthalate and polyethylene-2,6-naphthalate. The polyester may be either a homopolymer or a product copolymerized with a third component. In the present invention, a preferred polyester is the one having 70 molar % or more, preferably 80 molar % or more, and more preferably 90 molar % or more of ethylene terephthalate unit, butylene terephthalate unit or ethylene-2,6-naphthalate unit.

As a catalyst for polycondensation of a polyester, there may be used a catalyst containing antimony compound, titanium compound, germanium compound, tin compound, aluminum and/or a compound thereof and a phosphorus compound having an aromatic group in a molecule, a catalyst containing aluminum salt of phosphor compound, etc. The catalysts as such may be coexisted in appropriate amounts within such an extent that no problem is resulted thereby in terms of characteristic, processability and color tone of the polyester.

It is also possible to further enhance the thermostability of a polyester by such a means that, after polymerization of a polyester, a catalyst is removed from the resulting polyester or a catalyst is inactivated by addition of a phosphorus compound or the like.

During the polymerization of polyester, dialkylene glycol is by-produced. When exposed to high temperature for a long period as a solar cell material, there is a case where heat resistance lowers by the influence of dialkylene glycol. When an explanation is done taking diethylene glycol as a typical dialkylene glycol, amount of diethylene glycol is preferred to be 2.3 molar % or less. It is more preferred to be 2.0 molar % or less, and it is further preferred to be 1.8 molar % or less. When amount of diethylene glycol is made within the above range, thermostability can be enhanced and an increase in the concentration of carboxyl terminal (a rise in acid value) due to the decomposition upon drying or molding can be made far less. The less the amount of diethylene glycol, the better but diethylene glycol is produced as a by-product upon esterifying reaction of terephthalic acid or upon ester interchange reaction of dimethyl terephthalate in the production of polyester and, practically, its lower limit is 1.0 molar % or, further, 1.2 molar %.

Depending upon the object of use, the polyester may contain one or more additive (s) such as fluorescent whitener, ultraviolet preventer, infrared absorbing dye, thermostabilizer, surfactant or antioxidant. As an antioxidant, that of an aromatic amine or phenol type can be used. As a stabilizer, that of a phosphorus type (e.g., phosphoric acid and phosphate), a sulfur type or an amine type can be used.

When exposed outside for long time as a solar cell component, there may be the case where molecular weight of polyester lowers due to deteriorative decomposition, resulting in lowering of film strength. Therefore, it is necessary that, in the polyester film of the present invention, limiting viscosity of the film is 0.60 to 0.80 dL/g for imparting the durability as a solar cell component. When the limiting viscosity of the film is less than the above lower limit, it is difficult to achieve a long-term resistance to hydrolysis as a solar cell component while, when it is more than the above upper limit, breaking upon film manufacture is apt to happen. In addition, a rise in temperature takes place due to heat generation in a melt extruder and it becomes difficult to uniformly mix the inorganic fine particles in the polyester. Lower limit of the above limiting viscosity is preferably 0.63 dL/g, more preferably 0.64 dL/g, and further preferably 0.65 dL/g. Upper limit of the above limiting viscosity is preferably 0.79 dL/g and more preferably 0.78 dL/g.

A carboxyl terminal of the polyester has an action of promoting the hydrolysis due to its self-catalytic action. Therefore, for achieving a high resistance to hydrolysis as a solar cell component, it is necessary that acid value of the film of the present invention is within a range of 1 to 30 eq/ton. The above acid value is preferred to be 3 to 30 eq/ton and more preferred to be 5 to 30 eq/ton. When the acid value is more than the above range, resistance to hydrolysis lowers, durability as a solar cell component cannot be achieved and deterioration in early stage is apt to happen. Acid value of the film or the polyester can be measured by a titration method or by an NMR method which will be mentioned later.

For making the acid value of the polyester film within the above range, it is preferred that acid value of the polyester tip used as a material resin is made less than 25 eq/ton. The acid value of the polyester tip used is more preferred to be less than 20 eq/ton, further preferred to be less than 13 eq/ton, furthermore preferred to be less than 10 eq/ton, particularly preferred to be less than 8 eq/ton, more particularly preferred to be less than 5 eq/ton. Making the acid value of the polyester chip within the above range can be conducted by appropriately selecting the polymerization condition of the resin. For example, it can be conducted by appropriately setting the factor of the manufacturing apparatus such as the structure of the esterifying reaction apparatus; the esterifying reaction condition such as the composition ratio of dicarboxylic acid to glycol to be supplied to an esterifying reactor, temperature for the esterifying reaction, pressure for the esterifying reaction or time for the esterifying reaction; or the condition for solid-phase polymerization. Further, as will be mentioned later, it is preferred to control the moisture content of the polyester chip or to control the resin temperature in the melting step. It is also possible that a carboxyl terminal of the polyester is sequestered by an epoxy compound, a carbodiimide compound, etc. Although it is preferred that the acid value of the polyester film is small, its lower limit has been believed to be 0.5 eq/ton in view of the productivity.

For utilizing the light effectively and enhancing the photoelectric conversion efficiency of the solar cell device, the polyester film of the present invention has a high light reflectance. In the polyester film of the present invention, the light reflectance at 550 nm wavelength is 50% or more, preferably 60% or more and further preferably 70% or more. Since the polyester film of the present invention well scatters the light, quantity of light returning to the solar cell device increases and it is advantageous for being used in a thin-membrane solar cell. With regard to the above range of light reflectance, although it is sufficient when its measured value in any side of the film satisfies the range, the case where the values satisfy the above range in both sides of the film is preferred since freedom of processing increases thereby.

Further, it is preferred that degree of whiteness of the polyester film of the present invention is 50 or more, more preferred to be 60 or more, and further preferred to be 80 or more.

For controlling the light reflectance to the above range, the polyester film of the present invention contains 3 to 50% by mass, preferably 3.50 to 25% by mass, of inorganic fine particles to the total mass of the film. When the amount of the inorganic fine particles is less than 3% by mass, it is difficult to make the light reflectance at 550 nm wavelength 50% or more. When the amount is more than 50% by mass, weight of the film becomes too big, which makes the handling in a processing, etc. difficult.

Average particle size of the inorganic fine particles is preferred to be 0.1 to 3 μm and more preferred to be 0.5 to 2.5 μm. When average particle size of the inorganic fine particles is less than 0.1 μm, there may be the case where light reflectivity characteristic cannot be advantageously enhanced by a light scattering effect. When average particle size of the inorganic fine particles is more than 3 μm, there may be the case where breakage of the film is resulted or manufacture of the film cannot be advantageously carried out.

In the present invention, average particle size of the inorganic fine particles is determined by an electron microscopic method. To be more specific, the following method is conducted. Thus the fine particles are observed under a scanning electron microscope and the pictures are taken thereby appropriately changing the multiplications depending upon the particle size, and the taken pictures are enlarged and copied. As to at least 100 fine particles selected randomly, the outer circumference of each particle is traced. Diameters corresponding to the circles of the particles are measured from the traced images using an image analyzer and the mean value thereof is adopted as an average particle size.

Although the inorganic fine particles to be contained in the polyester film of the present invention are not particularly limited, examples thereof include silica, kaolinite, talc, calcium carbonate, zeolite, alumina, barium sulfate, carbon black, zinc oxide, titanium oxide and zinc sulfate. In view of light reflectivity and productivity, white pigment or, in other words, titanium oxide or barium sulfate is preferred, and titanium oxide is more preferred.

Since solar cell in outside is irradiated with sunlight for long time, durability against deterioration by light is demanded. With regard to such a respect, it is preferred to add particles of titanium dioxide mainly comprising a rutile type as the inorganic fine particles to be used for the film of the present invention. In titanium oxide, two crystalline forms of rutile type and anatase type have been mainly known. There are such characteristic properties that anatase type has a very big spectral reflectance for ultraviolet ray and that rutile type has a big absorption rate for ultraviolet ray (small spectral reflectance). When an ultraviolet absorbing property of rutile type is utilized paying the attention to such a difference in spectral characteristic in the crystal form of titanium dioxide, resistance to light can be advantageously improved. As a result thereof, the film of the present invention has excellent film durability under irradiation of light even when other ultraviolet absorber is not substantially added. Therefore, problems such as pollution and lowering of close adhesion by bleeding out of ultraviolet absorber hardly take place.

The term "main component" used herein means that the amount of titanium dioxide of rutile type in all titanium dioxide particles is more than 50% by mass. Amount of titanium dioxide of anatase type in all titanium dioxide particles is preferred to be 10% by mass or less. It is more preferred to be 5% by mass or less and further preferred to be 0% by mass. When the amount of titanium dioxide of anatase type is more than the above upper limit, the amount of titanium dioxide of rutile type in all titanium dioxide particles becomes small whereby the ultraviolet absorbing property becomes insufficient and, besides that, since titanium dioxide of anatase type has a strong photocatalytic action, resistance to light tends to lower by such an action as well. Titanium dioxide of rutile type and that of anatase type can be discriminated by X-ray structure diffraction or spectral absorption characteristic. Incidentally, surfaces of titanium oxide particles of rutile type may be subjected to an inorganic treatment using, for example, alumina or silica or may be subjected to an organic treatment using, for example, silicone or alcohol.

According to the above-mentioned constitution, the film of the present invention can achieve excellent durability even under irradiation of light. To be more specific, in the film of the present invention, the retention rate of breaking elongation can be 35% or more, further it can be 40% or more, when UV irradiation is done for 100 hours with irradiation intensity of 100 mW/cm² at 63° C. and 50% RH. Since the film of the present invention suppresses photodecomposition and deterioration as such under irradiation of light, it is advantageous as a backside sealing sheet for solar cell used outside.

Addition of the inorganic fine particles into the film can be carried out by the known method and it is preferred to conduct by a master batch method (MB method) where polyester resin and fine particles are previously mixed using an extruder. According to such a method, inorganic fine particles can be advantageously dispersed in the polyester and uneven light reflectivity in the film surface can be suppressed.

In preparing a master batch, a rise in acid value may happen due to hydrolysis of the polyester. Therefore, it is preferred to control the moisture in preparing a master batch. The polyester resin and inorganic fine particles are poured into an extruder and, together with removal of moisture and air therefrom, a master batch can be prepared. More preferably, when a master batch is prepared using a polyester resin which was previously dried even only a little, a rise in acid value of the polyester can be suppressed. In that case, there will be a method where extrusion is conducted together with deaeration, a method where extrusion is conducted without deaeration using a well-dried polyester resin or the like.

In preparing a master batch, it is preferred that the polyester resin to be poured is previously dried to reduce the moisture content therein. As to a drying condition, it is preferred to dry at 100 to 200° C., more preferably 120 to 180° C., for 1 hour or longer, more preferably for 3 hours or longer and further preferably 6 hours or longer. At that time, drying is conducted sufficiently so as to make the moisture content of the polyester resin preferably 50 ppm or less and more preferably 30 ppm or less. There is no particular limitation for a method of previous mixing but either a method by batch or a method using a uniaxial, biaxial or higher axial kneading extruder may be used. In preparing a master batch together with deaeration, it is preferred that the polyester resin is melted at the temperature of 250 to 300° C., preferably 270 to 280° C., one or, preferably, two or more deaeration orifice (s) is/are formed in the preliminary kneader and a continuous sucking deaeration is conducted at 0.05 MPa or more, preferably 0.1 MPa or more, so as to maintain the reduced pressure in the mixer.

In view of suppressing the in-face variation of light reflectance of the film, the film of the present invention is preferred to be manufactured adopting a master batch method. However, due to hysteresis of heat and shear during the preparing process of the master batch, there may be the case where molecular weight (limiting viscosity) lowers from that of the original polyester resin. Therefore, there may be the case where, even when mixed with a polyester resin of high molecular weight, no predetermined limiting viscosity as a film can be achieved whereby a long-term durability as a solar cell lowers. Particularly when concentration of the inorganic fine particles in the film is made high for achieving a good light reflectivity, the mixing rate of the master batch is also apt to become high. Therefore, for achieving a predetermined limiting viscosity as a film advantageously, it is preferred that the master batch is further subjected to a solid-phase polymerization. Up to now, it has been believed that application of a solid-phase polymerization treatment to a master batch containing many particles is to be avoided since it promotes the degree of crystallization of the polyester and lowers the dispersibility of the particles. However, as a result of such a treatment, the acid value can be advantageously reduced in spite of containing the particles of high concentration whereby the high limiting viscosity can be maintained. As a result thereof, compatibility of both excellent light reflectivity and durability can be advantageously achieved.

Solid-phase polymerization of the master batch can be conducted using a batch-type apparatus or a continuous-type apparatus. Solid-phase polymerization of the polyester can be carried out by a conventionally known method. For example, a preliminary crystallization is conducted in inert gas, in vacuo, in water vapor or in an inert gas atmosphere containing water vapor at the temperature of 100 to 210° C. for 1 to 5 hour (s) and then a solid-phase polymerization is conducted in an inert gas atmosphere or in vacuo at the temperature of 190 to 230° C. for to 30 hour (s). As to the time of the solid-phase polymerization, it is preferred to be conducted until reaching the predetermined limiting viscosity by measuring the limiting viscosity of the polyester by means of sampling. Acid value of a master batch is controlled by the acid value of the polyester (prepolymer) to be subjected to the solid-phase polymerization, by the conditions for adjusting the humidity of the prepolymer, by the conditions for the crystallization, by the conditions for the solid-phase polymerization, etc. Acid value of the polyester can be made low by lowering the acid value of the prepolymer, by suppressing the hydrolysis during the crystallizing step or a solid-phase polymerization step by making the moisture amount to be impregnated during the humidity adjustment of the prepolymer, by enhancing the ethylene glycol concentration in an inert gas stream used upon the solid-phase polymerization, etc.

Limiting viscosity of the master batch after the solid-phase polymerization prepared as such is preferred to be 0.68 to 0.90 dL/g and more preferred to be 0.70 to 0.85 dL/g. Acid value is preferred to be 1 to 25 eq/ton. Although the film of the present invention can be prepared by mixing a master batch comprising a polyester resin containing inorganic fine particles with a polyester resin containing no inorganic fine particle followed by pouring into an extruder and by elongating the melt-extruded sheet at least in one direction, it is preferred that a master batch comprising a polyester resin containing inorganic fine particles is subjected to a solid-phase polymerization and then mixed with a polyester resin containing no inorganic fine particle. Since the crystallinity highly proceeds in the polyester resin after the solid-phase polymerization, no crystallizing peak (exothermic peak at near 120° C. in the case of polyethylene terephthalate) is noted when the polyester is subjected to differential scanning calorimetry. It is possible to judge thereby whether the treatment by a solid-phase polymerization was carried out.

For a purpose that the film of the present invention maintains high durability when used as a solar cell, it is preferred that the polyester resin to be mixed with the master batch is also subjected to the solid-phase polymerization as mentioned above. As a result thereof, a film having predetermined limiting viscosity and acid value can be advantageously prepared. Here, for making the in-face light reflection characteristic of the film surface uniform, it is preferred that the master batch chip and the polyester chip to be mixed therewith are uniformly mixed. In that case, when there is a difference between the limiting viscosities of the master batch chip and the polyester chip to be mixed therewith since both are highly crystallized, there may be the case where difference in the melting and flowing behaviors is resulted between them whereby the dispersibility of fine particles in the polyester resin lowers. Difference between the limiting viscosity of the master batch and the limiting viscosity of the polyester resin to be mixed therewith is preferred to be 0.15 dL/g or less, more preferred to be 0.10 dL/g or less, and further preferred to be 0.08 dL/g or less.

For suppressing the hot spot of a solar cell module, it is preferred to make the light reflection characteristic of the backside protective membrane uniform within a face. To cope with the trend of making the size larger in recent years, uniformity of the light reflectivity in the protective membrane face of at least 1 m×1.8 m which is the widely used size is demanded and, more preferably, uniformity of the light reflectivity in a film roll is demanded. In the present invention, the in-face variation (maximum value−minimum value) of the light reflectance of a film sample group collected by the sampling method which will be mentioned later is preferred to be within 5%, more preferred to be within 4.5%, and further preferred to be within 4% to the mean value of the light reflectance. As a result thereof, generation of hot spot of the solar cell module can be advantageously suppressed.

When the film of the present invention is made into a roll, its wound length is preferred to be 1500 m or longer and more preferred to be 1800 m or longer. The upper limit of the wound length is preferred to be 5000 m. Width of the film roll is preferred to be 500 mm or more and more preferred to be 800 mm or more. Upper limit of the width of the film roll is preferred to be 2000 mm.

The polyester film of the present invention can achieve high electric insulation even if the film is thin. Further, due to its excellent durability and reflectivity, the conventional durable layer (hydrolysis-resisting layer), white-colored layer and insulation layer can be integrated. Therefore, when the polyester film of the present invention is used as a sheet for sealing the backside of solar cell, it is now possible to cope with a demand for making the solar cell module into light weight and thin membrane.

In the polyester film of the present invention, its partial discharge voltage is preferred to be 550 V or higher, more preferred to be 560 V or higher and further preferred to be 570 V or higher. When the partial discharge voltage is within the above range, high electric insulation is achieved whereby that is advantageous for making the sealing sheet of backside of solar cell into thin membrane and also for making the solar cell module into large size.

Thickness of the polyester film of the present invention is preferably 30 to 300 μm, more preferably 35 to 250 μm, further preferably 40 to 230 μm, and furthermore preferably 40 to 200 μm. When the film thickness is less than the above lower limit, it is difficult to advantageously achieve the insulating effect while, when the thickness is more than the above upper limit, it is no longer advantageous for making into light weight and thin membrane as a sealing sheet for the backside of solar cell.

For controlling the partial discharge voltage to the above range, it is preferred to form many cavities in the film. Generally, the cavities existing in an insulation layer are the causes for the partial discharge. It has been believed however that, when many fine cavities are generated in a film, voltage applied to the film is divided into fine cavities and the partial discharge voltage increases as a whole. Therefore, in making the partial discharge voltage high while maintaining the thinness of the film, it is preferred in the present invention that fine cavities are made to exist abundantly in the thickness direction.

In order to advantageously control the partial discharge voltage to the above range, it is preferred that layered numbers of cavities existing in the thickness direction of the polyester film of the present invention are 5 or more and further that the density of layered numbers of cavities defined by the following formula satisfies the range of 0.1 to 7/μm:

Density of layered numbers of cavities(numbers/μm)=
[Layered numbers of cavities in the thickness direction of film(numbers)]/[Thickness of film (μm)]

The layered numbers of cavities existing in the thickness direction of the film is more preferred to be 7 or more and further preferred to be 10 or more. As a result of increasing the numbers of fine cavities existing in the thickness direction of the film, the partial discharge voltage becomes advantageously high due to the voltage dispersing effect.

With regard to the density of layered numbers of cavities existing in the inner area of the cavity-containing film in view of the partial discharge voltage, it is better when the density is more. However, when it is too big, strength of the film is apt to lower. In order to make the dielectric breakdown voltage high while maintaining the practically necessary film strength, it is preferred that the upper limit of the above-mentioned density of layered numbers of cavities is made 5/μm and, more preferably, it is made one/μm.

Examples of a method for expressing the fine cavities in the film include (1) a method where a resin composition having a sea-island structure and comprising the polyester and a dispersion of thermoplastic resin which is not compatible with said polyester is extruded into a sheet form and then stretched so as to form cavities (air) around the above dispersion and (2) a method where a resin composition in which particles are made to contain in the polyester is extruded into a sheet form and then stretched so as to form cavities (air) around the above particles. Between the above, the former method is preferred.

There is no particular limitation for the thermoplastic resin which is an island component being incompatible with the polyester. Although such a resin may be either a homopolymer or a polymer having a copolymerizing component, a material where polyolefin or polystyrene is a main component is preferred. Further, the polystyrene is not always limited to a homopolymer but may be a copolymerized polymer where various components are copolymerized.

A compounding amount of the thermoplastic resin being incompatible with the polymer is preferred to be 1 to 30% by mass and more preferred to be 5 to 18% by mass to the total materials used for the manufacture of the film. When it is less than 1% by mass, there is a limitation for increasing the production amount of the cavities. On the contrary, when it is more than 30% by mass, stretching property of the film is significantly deteriorated and, moreover, there is a possibility that heat resistance, strength and toughness are deteriorated.

Examples of the polyolefin include polyethylene, polypropylene, polymethylpentene, various kinds of cyclic olefin polymers and copolymerized products thereof. Among the polyolefins as such, polymethylpentene is preferred since it rarely softens even at high temperature and has an excellent cavity-expressing property. When polymethylpentene is used as a main component of polyolefin, its sole use is not always necessary but other polyolefin may be added also as an auxiliary component. Examples of the resin used as an auxiliary component include polyethylene, polypropylene and products thereof being copolymerized with various components. It is preferred that the amount of the polyolefin added as an auxiliary component does not exceed the adding amount of the resin added as a main component.

As the polystyrene, there is a thermoplastic resin containing a polystyrene structure as a basic constituting element. Examples thereof include a homopolymer such as atactic polystyrene, syndiotactic polystyrene or isotactic polystyrene; a modified resin where other component is subjected to graft or block copolymerization such as shock-resisting polystyrene resin and modified polyphenylene ether resin; and a mixture with a thermoplastic resin being compatible with those polystyrene resins such as polyphenylene ether.

The polyester film of the present invention may be in a single layer or in a laminated structure comprising two or more layers. The film of the present invention is often used as a component for a solar cell by being laminated with other constituting layer and, when cavities in the film are present near the surface, strength of the film surface lowers and interface detachment is apt to happen. Accordingly, the film of the present invention may also be made into such a laminated structure which consists of a skin layer comprising a polyester layer where many inorganic fine particles exist and of a core layer comprising a polyester layer containing many cavities derived from thermoplastic resin being incompatible with the polyester.

When the film is made into a three-layered constitution consisting of a core layer and two skin layers sandwiching the former, it is preferred that the thickness ratio of the skin layer to the core layer is 5 to 20%, more preferred to be 8 to 18% and further preferred to be 10 to 15% in terms of the skin layer thickness (total thickness of both skin layers) to the total layer thickness of the film. When the ratio of the skin layer thickness is less than the above lower limit, surficial strength of the film lowers and, when it is layered with other layer as a sealing sheet for a solar cell, detachment between the layers is apt to happen. When the ratio of the skin layer thickness is more than the above upper limit, layered numbers of cavities by a core layer becomes difficult to secure and an electric insulation property is hardly apt to be achieved.

In the film of the present invention, its apparent specific gravity is preferred to be 0.8 to 1.3, more preferred to be 0.9 to 1.3, and further preferred to be 1.0 to 1.2. When the apparent specific gravity is less than 0.8, the film is not tough and a process for the preparation of a solar cell module is difficult. Particularly when the size of a sealing sheet for the backside becomes large, a buckling property in broad width is apt to happen. When the apparent specific gravity is more than 1.3, weight of the film is big whereby there is a possibility that it becomes a burden in the case of reducing the weight of the solar cell.

Although there is no particular limitation for the method of manufacturing a film in a layered constitution, it is preferred to adopt, for example, a co-extrusion method where a polyester resin of the skin layer containing fine particles and a polyester resin of the core layer containing an incompatible thermoplastic resin are supplied to different extruders, layered in a melted state and extruded from the same die.

The polyester chip is melted in an extruder by the above method and the resin is pulled out in a sheet form from a die using a cooling roll whereupon a non-stretched film is formed. In that case, it is preferred to use a well-dried polyester chip so as to suppress an increase in the acid value during the manufacture of a film. Moisture content of the polyester chip used therefor is preferred to be 100 ppm or less, more preferred to be 50 ppm or less, and further preferred to be 30 ppm or less. As a method for drying a polyester chip, a known method such as vacuum drying may be used.

The highest temperature of the polyester resin in an extruder is preferred to be 280° C. to 310° C. and more preferred to be 290° C. to 300° C. When the melting temperature is made high, back pressure upon filtration in an extruder lowers and good productivity can be achieved but, when the resin temperature is made higher than 310° C., there may be the case where thermal deterioration of the resin proceeds and acid value of the polyester increases whereupon the resistance to hydrolysis lowers.

Then, after the resulting non-stretched film is heated with a heating roll or a non-contacting heater, it is stretched between rolls having the difference between their speeds (roll stretch), then both ends of the uniaxially stretched film are held by clips, heating is conducted in an oven, stretch is carried out in a widthwise direction and high-temperature heat is applied to conduct a thermal setting (tenter stretch). It is also possible to conduct a biaxial alignment treatment by means of, for example, a simultaneous biaxial stretch (simultaneous biaxial stretch by tenter) where stretch is done using a tenter having a mechanism for conducting a simultaneous stretch in both longitudinal and transverse directions or a stretch by expansion using air pressure (inflation stretch).

As a result of such an orientation treatment, interface detachment between the polyester and the incompatible thermoplastic resin or between the polyester and the fine particles is resulted whereupon many fine cavities are expressed. Accordingly, the conditions for subjecting the non-stretched sheet to a stretching and orientation treatment are closely related to the formation of cavities.

When a more highly dimensional stability against heating is demanded as a solar cell component, it is desirable to apply a longitudinal relaxation treatment. As a method for the longitudinal relaxation treatment, there may be utilized, for example, a method where a longitudinal relaxation is conducted by making the space between the clips of the tenter gradually narrow or a method where relaxation treatment is conducted by avoiding the influence of the clips by means of cutting the edge using a razor in a tenter. It is also possible to use a method where an off-line heat is applied to relax. The thermal shrinking rate in longitudinal and transverse directions is preferred to be within a range of 0 to 4.0% and more preferred to be within a range of 0.2 to 3.0%. When the thermal shrinking rate is in a negative value, the film slackens upon processing and that causes a problem. When the thermal shrinking rate is more than 4.0%, the shrinkage upon processing is big whereby washboard-like wrinkles are generated and that is not preferred.

Further, for imparting various functions such as adhesive property, insulating property and anti-scratching property, a polymer resin may be coated on the film surface by a coating method. Still further, inorganic and/or organic particles may be made to contain only in the coating layer so as to make into an easily slidable polyester film. Still further, inorganic vapor deposition layer or aluminum layer may be formed to impart a barrier function to steam vapor. In the film of the present invention however, it is preferred that the film surface is flat and smooth when it is used as a sealing sheet for the backside by layering with other layer. In that case, the three-dimensional surface roughness (SRa) of the film of the present invention is preferred to be 0.1 μm or less.

When an applied layer having an easy adhesive property is formed on the polyester film of the present invention, it is preferred to use an aqueous applying solution containing at least one of water-soluble or water-dispersible copolymerized polyester resin, acrylic resin and polyurethane resin. Examples of the applying solution include water-soluble or water-dispersible copolymerized polyester resin solution, acrylic resin solution and polyurethane solution which are disclosed, for example, in Japanese Patent No. 3,567,927, Japanese Patent No. 3,589,232 and Japanese Patent No. 3,589,233. Such an applied layer may be formed after making into a film (off-line coating method) or may be formed during making into a film (in-line coating method). In view of the productivity, it is preferred to form during the course of making into a film.

Particularly when the film of the present invention is used in a face contacting an encapsulation foil such as EVA, it is preferred that the film of the present invention has an adhesive property to EVA. In that case, a urethane resin can be used as a main component. Particularly when the urethane resin where aliphatic polycarbonate polyol is a constituting component is made to contain in the applied layer, an adhesive property as a solar cell component under moisture- and heat-resistance can be enhanced. It is preferred that an aliphatic polycarbonate polyol having an excellent resistance to heat and hydrolysis is made to contain in a diol component which is a constituting component of the urethane resin. In view of prevention of yellowing by sunlight as well, it is preferred to use an aliphatic polycarbonate polyol.

Examples of the aliphatic polycarbonate polyol include aliphatic polycarbonate diol and aliphatic polycarbonate triol. Number-average molecular weight of the aliphatic polycarbonate polyol is preferred to be 1500 to 4000 and more preferred to be 2000 to 3000. When the number-average molecular weight of the aliphatic polycarbonate polyol is too small, a strong and hard urethane component increases and stress due to thermal shrinkage of the substrate cannot be relaxed any more whereby there may be the case where the adhesive property lowers.

When a polyol compound having a carboxylic acid (carboxylate) group is used as a copolymerizing component for imparting a water solubility, the composing molar ratio of the polyol compound having carboxylic acid (carboxylate) group in the urethane resin is preferred to be 3 to 60 molar % and more preferred to be 5 to 40 molar % in case the total polyisocyanate component in the urethane resin is 100 molar %. When the above composing molar ratio is less than 3 molar %, there may be the case where dispersibility in water lowers. When the above composition molar ratio is more than 60 molar %, there may be the case where resistance to water lowers whereby resistance to moist heat lowers.

Glass transition temperature of the urethane resin is preferred to be lower than 0° C. and more preferred to be lower than −5° C. When the glass transition temperature is lower than 0° C., viscosity of the urethane resin becomes near the viscosity of the partially melted olefin resin such as EVA or PVB upon adhesion with pressure whereby it contributes in enhancing the strong adhesion due to partial mixing and softness which is advantageous in view of relaxation of stress of the applied layer is apt to be achieved.

In the polyester film of the present invention, the retaining rate of elongation at 105° C., 100% RH and 0.03 MPa for 192 hours is preferred to be 65% or more and more preferred to be 70% or more. When the retaining rate of elongation is within such a range, the polyester film of the present invention can achieve high resistance to hydrolysis being durable for a long-term outside use.

In the polyester film of the present invention, its thermal shrinking rate at 150° C. is preferred to be −0.5% to 3.0% and more preferred to be −0.5% to 2.0% in both lengthwise direction (longitudinal direction) and widthwise direction (transverse direction). When there is a demand for severer thermal shrinking rate as a solar cell such as precision in the use at high temperature or in the process at high temperature, its thermal shrinking rate at 150° C. is preferred to be −0.5% to 0.5% in both lengthwise direction (longitudinal direction) and widthwise direction (transverse direction). As a result thereof, it is possible to suppress the generation of curl upon a heating process (such as upon formation of an adhesive layer) or in a layered state. An example of a method for making the thermal shrinking rate at 150° C. within the above range is a method where the stretching condition is controlled or where longitudinal relaxation treatment and transverse relaxation treatment are conducted during a thermal setting step.

For retaining the breaking elongation of the film, it is preferred that orientations of the film in longitudinal and transverse directions are well balanced. MOR value converted to the case where the film thickness of the polyester film of the present invention is 50 μm (MOR-C) is preferred to be 1.0 to 2.0 and more preferred to be 1.3 to 1.8. As a result thereof, balance of the film in longitudinal and transverse directions can be adjusted and that is effective in maintaining the mechanical strength and durability. Generation of curl upon layering can be also suppressed thereby and that is effective for enhancing the close adhesion as well. An example of a method for making the MOR-C within the above range is a method where the ratio of stretching magnifications in longitudinal and transverse directions during the stretching step is controlled.

The solar cell module of the present invention is a system where incident light such as sunlight or room light is received and converted into electricity and the resulting electricity is stored. Said module is constituted from surface protecting sheet, high transmission material for light, solar cell device, encapsulation foil layer, backside sealing sheet, etc.

The polyester film of the present invention can be used as abase film for a backside sealing sheet or a laminating material for flexible electronic components. It is particularly advantageous as abase film for a backside sealing sheet for a solar cell where high durability and long-term thermostability are demanded. The backside sealing sheet is applied for protecting the backside of a solar cell device of a solar cell module.

The polyester film of the present invention can be used for the face of the side contacting the encapsulation foil of the solar cell module and/or for the outermost face of the solar cell module as a backside sealing sheet either solely or by adhering two or more sheets. For a purpose of imparting a barrier property against water vapor, the backside sealing sheet may be layered with a film or an aluminum foil having a barrier property against water vapor. As the film having a barrier property, there may be used poly(vinylidene fluoride)-coated film, silicon oxide-deposited film, aluminum oxide-deposited film, aluminum-deposited film, etc. They may be used by layering to the polyester film of the present invention either directly or via an adhesive layer or in a form of a sandwiched structure.

EXAMPLES

Examples and Comparative Examples of the present invention will be shown as hereunder. Methods for measurement and evaluation used in the present invention are as follows:
1) Apparent Density of the Film Apparent density of the film was measured according to JIS-K-7222 "Foamed plastics and rubbers—measurement of apparent density". For simplifying the expression, its unit was calculated in g/cm$^3$.
2) Degree of Whiteness Degree of whiteness was measured according to JIS-L1015-1981-method B using Z-1001DP manufactured by Nippon Denshoku Kogyo.
3) Acid Value Acid value was measured by the following method for the film and the material polyester resin:

(1) Preparation of Samples

Film or material polyester resin was ground, dried in vacuo at 70° C. for 24 hours and weighed within a range of 0.20±0.0005 g using a balance. The mass at that time was W (grams). Benzyl alcohol (10 ml) and the weighed sample were added to a test tube, the test tube was dipped in a benzyl alcohol bath heated at 205° C. and the sample was dissolved by stirring with a glass rod. The samples when the dissolving time was 3, 5 and 7 minutes were called A, B and C, respectively. After that, a fresh test tube was provided, only benzyl alcohol was placed therein, the same treatment as above was conducted and the samples where the dissolving time was 3, 5 and 5 minutes were called a, b and c, respectively.

(2) Titration

Titration was conducted using 0.04 mol/l potassium hydroxide solution (ethanolic solution) for which a factor was already known. Phenol Red was used as an indicator and a titrated amount (ml) of potassium hydroxide solution was determined at the end point which was a stage when yellowish green color turned pale red color. Titrated amounts for the samples A, B and C were called XA, XB and XC (ml), respectively. Titrated amounts for the samples a, b and c were called Xa, Xb and Xc (ml), respectively.

(3) Calculation of Acid Value

The titrated amounts XA, XB and XC for each dissolving time were used and the titrated amount V (ml) when the dissolving time was 0 minute was calculated by means of a least-squares method. Similarly, using Xa, Xb and Xc, the titrated amount V0 (ml) was determined. After that, an acid value was calculated by the following formula.

$$\text{Acid value(eq/ton)} = [(V-V0) \times 0.04 \times NF \times 1000]/W$$

NF: Factor for 0.04 mol/l potassium hydroxide solution

4) Treatment for Resistance to Hydrolysis

As a treatment for resistance to hydrolysis, HAST (Highly Accelerated temperature and humidity Stress Test) stipulated by JIS-60068-2-66 was conducted. As an instrument, EHS-221 manufactured by Espec was used and the test was conducted under the conditions of 105° C., 100% RH and 0.03 MPa.

The film was cut into 70 mm×190 mm and the films were placed using a jig. Each film was placed keeping intervals among the films so that the film does not touch each other. The treatment was conducted for 200 hours under the conditions of 105° C., 100% RH and 0.03% MPa.

5) Treatment for Resistance to Light

As a treatment for accelerated resistance to light, a continuous UV irradiation treatment was conducted for 100 hours at 63° C., 50% RH and 100 mW/cm$^2$ irradiation intensity using Eye Super UV Tester SUV-W151 manufactured by Iwasaki Electric.

6) Retaining Rate of Breaking Elongation

Resistance to hydrolysis and resistance to light were evaluated by a retaining rate of breaking elongation. The breaking elongations before and after each of the treatments were measured according to JIS-C-2318-1997 5.3.31 (Tensile strength and elongation percentage) and the retaining rate of breaking elongation was calculated by the following formula:

Retaining rate of breaking elongation(%)=[(Breaking elongation after the treatment)×100]/(Breaking elongation before the treatment)

7) Layered Numbers of the Cavities Existing in the Thickness Direction of the Film and the Density of Layered Numbers of the Cavities of the Film A scanning electron microscope was used for observation of the cavities on the section of the film and, in five places of different sites of a sample, a broken section which was parallel to the longitudinal stretch direction and vertical to the film surface was observed. The observation was conducted in the appropriate magnifications of 300 to 3000 and pictures were taken in such a manner that the dispersed state of the cavities in the total thickness of the film can be confirmed. After that, at any place on the photographic picture, a straight line was drawn in a vertical direction to the film surface and the cavity numbers crossing this straight line were counted. This cavity numbers are defined as the cavity numbers (layered numbers) in the thickness direction of the film. Further, total thickness (μm) of the film was measured along this straight line and the layered numbers of cavities are divided by the total thickness of the film to determine the density of layered numbers of cavities (numbers/μm). The measurement was done at five places for one sheet of the picture and a mean value of 25 places in total were defined as the density of layered numbers of cavities of a sample.

8) Thermal Shrinkage Rate of the Film at 150° C. (HS150)

Film was cut into a size of 10 mm width and 250 mm length in such a direction that the long side (250 mm) corresponds to a lengthwise or widthwise direction of the film, and marked at 200-mm intervals and the interval (A) was measured with a constant tension of 5 g. After that, the film was allowed to stand for 30 minutes in an oven of atmosphere of 150° C. without load. After the film was taken out from the oven and cooled down to room temperature, the mark interval (B) was determined with a constant tension of 5 g and thermal shrinkage rate was calculated by the following formula:

$$\text{Thermal shrinkage rate(\%)} = [(A-B)/A] \times 100$$

The thermal shrinkage rate of the film at 150° C. was measured at 100-mm intervals in the widthwise direction of the film, mean value of three samples was rounded off to two decimal places and the larger values in lengthwise direction and widthwise direction were used.

9) Measurement of Partial Discharge Voltage

Partial discharge voltage was measured according to the following measuring method to evaluate the electric insulation property:

(Measuring Method)

Standards used: IEC60664/A2:2002 4.1.2.4

Testing machine: KPD2050 (manufactured by KIKUSUI ELECTRONICS CORP.)

Starting voltage charge threshold value: 1.0 pC

Extinction voltage charge threshold value: 1.0 pC

Testing time: 22.0 s

Measured pattern: trapezoid

10) Limiting Viscosity (IV)

After the film or the polyester resin was ground and dried, it was dissolved into a mixed solvent of phenol/tetrachloroethane (=60/40; ratio by weight). After this solution was subjected to a centrifugal treatment to remove inorganic particles, running-down time of a solution of 0.4 (g/dl) and that of the solvent only were measured at 30° C. using a Ubbelohde's viscometer. From their time ratio, a limiting viscosity was calculated using a Huggins formula with a presumption that Huggins constant was 0.38.

11) Light Reflectance

In the resulting film roll, start and end of roll winding were defined 0% and 100%, respectively and a film piece of 1 m×1.8 m was cut out from the central area at each of the length positions 10%, 50% and 90%. Five film samples in regular squares of 20 cm square were sampled from four corners and the center of each film piece. The reflectance of a standard white board (manufactured by Hitachi High Technologies; Parts No. 210-0740) was measured by a spectrophotometer (U-3500; manufactured by Hitachi). With regard to each of the 15 film samples in total, the value at 550 nm wavelength was adopted as a light reflectance from the relative reflectance to the reflectance of a standard white board taken as 100%. Mean value of the light reflectances in each film sample was used as a central value and the value obtained after dividing the difference between the maximum and the minimum values of the resulting light reflectance by the central value was adopted as the variation of the light reflectance. Incidentally, the light reflectance in the table shows the resulting central value.

12) MOR-C

The resulting film was divided into five equal parts in a widthwise direction, a sample in regular square (100 mm in longitudinal and widthwise directions) was prepared in each position and measurement was conducted using a microwave permeation molecular orientation meter (MOA-6004 manufactured by Oji Keisoku Kiki). MOR-C was measured with the thickness correction of 50 μm and a mean value of five points was used.

13) Content of Diethylene Glycol (DEG)

Content of diethylene glycol was determined by means of gas chromatographic quantification after degradation of 0.1 g of the polyester by heating at 250° C. in 2 ml of methanol.

14) Surface Strength

The film was cut out into a size of 5 cm and 20 cm in longitudinal and transverse directions, respectively and its whole surface was adhered onto a flat glass plate using a polyester double-sided adhesive tape. An adhesive tape (manufactured by Nichiban; Cellotape (registered trade mark)) of 24 mm width was adhered onto the surface thereof over a length of 35 mm followed by being allowed to stand for 1 minute. After that, the tape was peeled off at a time in a direction of being vertical to the glass surface and the surface was observed. When the film surface was peeled off to an extent of 50% or more of the peeled area of the adhesive tape B, it was defined as "peeled off". In case the frequency of "peeled off" was less than one half upon five or more repetitions, it was evaluated as "○" (surface strength was excellent) while, incase the above was one half or more, it was evaluated as "x" (surface strength was inferior).

15) Strength Upon Processing

The film cut out into a size of 1 m×1.5 m was adhered in flat sheets and installed in an apparatus (LM-50×50S manufactured by NPC). After processing 50 sheets, outer appearances of all sheets were observed. When no bending was noted for all films, it was evaluated as "○" while, when one or more film(s) was/were bent, it was evaluated as "x".

16) Surface Flatness

Both surfaces of the film were measured using a three-dimensional roughness tester of stylus type (SE-3AK; manufactured by Kosaka Kenkyusho), under the conditions where needle radius was 2 load was 30 mg, cut-off value was 0.25 mm, measuring length was 1 mm, and moving speed of a needle was 0.1 mm/second, then the result was divided into 500 points with 2-μm pitch and the height of each point was put into a three-dimensional roughness analyzer (SPA-11). After that, average central surface roughness (SRa) was determined using the analyzer. When SRa of both sides of the film was 0.1 μm, it was evaluated as "○".

(Preparation of Polyester Resin Pellets)

Manufacture of PET Resin (PET-I)

Temperature of an esterifying reactor was raised and, when it reached 200° C., a slurry comprising 86.4 parts by mass of terephthalic acid and 64.4 parts by mass of ethylene glycol was charged and, as a catalysts, 0.017 part by mass of antimony trioxide and 0.16 part by mass of triethylamine were added thereto with stirring. Then the temperature was raised with pressure and, under the condition where gauge pressure was 3.5 kgf/cm² and temperature was 240° C., an esterification reaction was conducted under pressure. After that, inside of the esterification reactor was returned to atmospheric pressure, 0.071 part by mass of magnesium acetate tetrahydrate was added and then 0.014 part by mass of trimethyl phosphate was added thereto. Then the temperature was further raised up to 260° C. within 15 minutes, 0.012 part by mass of trimethyl phosphate was added and then 0.0036 part by mass of sodium acetate was added thereto. After 15 minutes, the resulting esterifying reaction product was transferred to a polycondensation reactor, the temperature was gradually raised from 260° C. to 280° C. in vacuo and a polycondensation reaction was carried out at 285° C.

After completion of the polycondensation reaction, a filtration treatment was conducted using a filter made of NASLON where a 95%-cut radius was 5 μM, the filtrate was extruded from a nozzle into a strand shape and cooled/solidified using a cooling water which was previously subjected to a filtering treatment (pore size: 1 μm or less) and the resulting one was cut into pellets. Limiting viscosity and acid value of the resulting PET resin (PET-I) were 0.616 dL/g and 15.1 eq/ton, respectively. Neither inactive particles nor particles separated into inside were substantially contained therein.

Manufacture of PET Resin (PET-II)

After the PET resin (PET-I) was previously subjected to preliminary crystallization at 160° C., it was subjected to a solid-phase polymerization under a nitrogen atmosphere at the temperature of 220° C. to give a PET resin (PET-II) having limiting viscosity of 0.71 L/g an acid value of 11 eq/ton.

Manufacture of PET Resin (PET-III)

The PET resin (PET-I) was subjected to the same method for the manufacture of PET-II except that the time for polycondensation reaction was changed to give a PET resin (PET-III) having limiting viscosity of 0.510 dL/g and acid value of 39 eq/ton.

Manufacture of PET Resin (PET-IV)

(Preparation of Polycondensation Catalyst Solution)

(Preparation of Ethylene Glycol Solution of Phosphorus Compound)

After 2.0 liters of ethylene glycol was added to a flask equipped with a nitrogen introducing pipe and a cooling jacket at ambient temperature and under atmospheric pressure, 200 g of Irganox 1222 (manufactured by Ciba Specialty Chemicals) was added as a phosphorus compound with stirring at 200 rpm in a nitrogen atmosphere. More 2.0 liters of ethylene glycol was additionally added thereto, temperature was raised by changing the temperature set for the jacket to 196° C. and, as from the stage when the inner temperature reached not lower than 185° C., stirring was conducted under refluxing for 60 minutes. After that, the heating was discontinued and the solution was immediately removed from the heat source and cooled down to 120° C. or lower within 30 minutes while the nitrogen atmosphere was still maintained. Mole fraction of Irganox 1222 in the resulting solution was 40% and that of a compound wherein the structure was changed from Irganox 1222 in the resulting solution was 60%.

(Preparation of Aqueous Solution of Aluminum Compound)

After 5.0 liters of pure water was added to a flask equipped with a cooling jacket at ambient temperature and under atmospheric pressure, 200 g of basic aluminum acetate was added as a slurry in pure water with stirring at 200 rpm. Pure water was further added so as to make 10.0 liters as a whole followed by stirring for 12 hours at ambient temperature and under atmospheric pressure. After that, temperature was raised by changing the temperature set for the jacket to 100.5° C. and, as from the stage when the inner temperature reached not lower than 95° C., stirring was conducted under refluxing for 3 hours. The stirring was discontinued and temperature was lowered down to room temperature to give an aqueous solution.

(Preparation of Ethylene Glycol Solution of Aluminum Compound)

The equivalent volume of ethylene glycol was added to an aqueous solution of aluminum compound prepared hereinabove, the mixture was stirred at room temperature for 30 minutes, the inner temperature was controlled to 80 to 90° C., the pressure was gradually reduced to reach 27 hPa and water was evaporated from the system by stirring for several hours to give an ethylene glycol solution of aluminum compound of 20 g/l. Peak integral value ratio in $^{27}$Al-NMR spectrum of the resulting aluminum solution was 2.2.

(Esterifying Reaction and Polycondensation)

There was provided a continuous polyester manufacturing apparatus comprising three continuous esterifying reactors and three polycondensation reactors and having an in-line mixer with a high-speed stirrer being installed in a transfer line from the third esterifying reactor to the first polycondensation reactor. Ethylene glycol (0.75 part by mass) to 1 part by mass of highly pure terephthalic acid was continuously supplied to a slurry-preparing tank in the above apparatus. The prepared slurry was continuously supplied and, under such reaction conditions where reaction temperatures and pressures of the first, second and third esterifying reactors were 250° C. and 110 kPa; 260° C. and 105 kPa; and 260° C. and 105 kPa, respectively, 0.025 part by mass of ethylene glycol was continuously poured into the second esterifying reactor to give a polyester oligomer. The oligomer was continuously transferred to a continuous polycondensation apparatus comprising three reactors. At the same time, the ethylene glycol solution of a phosphorus compound and the ethylene glycol solution of an aluminum compound prepared hereinabove were continuously added to an in-line mixer installed in the transfer line together with stirring using a mixer of a stirring type so that content of aluminum atom and content of phosphorus atom were made 0.015 molar % and 0.036 molar %, respectively, to acid component in the polyester. Then, polycondensation was carried out under such reaction conditions that reaction temperatures and pressures of the initial, intermediate and final polycondensation reactors were 265° C. and 9 kPa; 265 to 268° C. and 0.7 kPa; and 273° C. and 13.3 kPa, respectively to give a PET resin (PET-IV) having limiting viscosity of 0.630 dL/g and acid value of 10.5 eq/ton.

Manufacture of PET Resin (PET-V)

Solid-phase polymerization was conducted from PET resin (PET-IV) using a rotary vacuum polymerization reactor under reduced pressure of 0.5 mmHg at 220° C. for different reaction time to prepare a PET resin (PET-V) having limiting viscosity of 0.73 dL/g and acid value of 5.0 eq/ton.

Manufacture of PET Resin (PET-VI)

Solid-phase polymerization was conducted from PET resin (PET-IV) using a rotary vacuum polymerization reactor under reduced pressure of 0.5 mmHg at 220° C. for different reaction time to prepare a PET resin (PET-VI) having limiting viscosity of 0.79 dL/g and acid value of 4.0 eq/ton.

Manufacture of PET Resin (PET-VII)

Solid-phase polymerization was conducted from PET resin (PET-IV) using a rotary vacuum polymerization reactor under reduced pressure of 0.5 mmHg at 220° C. for different reaction time to prepare a PET resin (PET-VII) having limiting viscosity of 0.69 dL/g and acid value of 7.0 eq/ton.

Manufacture of PET Resin (PET-VIII)

Solid-phase polymerization was conducted from PET resin (PET-IV) using a rotary vacuum polymerization reactor under reduced pressure of 0.5 mmHg at 220° C. for different reaction time to prepare a PET resin (PET-VIII) having limiting viscosity of 1.01 dL/g and acid value of 3.0 eq/ton.

Manufacture of Master Batch Containing Fine Particles

Manufacture of Master Batch (MB-I) Containing Fine Particles

As a material, a mixture of 50% by mass of a PET resin (PET-I) previously dried at 120° C. in $10^{-3}$ torr for about 8 hours with 50% by mass of rutile-type titanium dioxide having an average particle size of 0.3 μm (according to an electron microscopic method) was supplied to a biaxial vent-type extruder and extruded at 275° C. together with deaeration by kneading to prepare master bath (MB-I) pellets containing fine particles of rutile-type titanium dioxide. Limiting viscosity and acid value of the resulting pellets were 0.45 dL/g and 42.2 eq/ton, respectively.

Manufacture of Master Batch (MB-II) Containing Fine Particles

Solid-phase polymerization was conducted from the above master batch (MB-I) pellets containing fine particles of rutile type titanium oxide using a rotary vacuum polymerization reactor under reduced pressure of 0.5 mmHg at 220° C. for different reaction time to prepare a master batch (MB-II) containing fine particles of rutile type titanium oxide and having limiting viscosity of 0.71 dL/g and acid value of 23.5 eq/ton.

Manufacture of Master Batch (MB-III) Containing Fine Particles

The same method as in the case of the master batch (MB-I) containing fine particles was conducted except that PET resin (PET-IV) was used instead of PET resin (PET-I) whereupon a master batch (MB-III) containing fine particles of rutile type titanium dioxide was prepared. Limiting viscosity and acid value of the resulting pellets were 0.46 dL/g and 36.3 eq/ton, respectively.

Manufacture of Master Batch (MB-IV) Containing Fine Particles

Solid-phase polymerization was conducted from the above master batch (MB-III) pellets containing fine particles of rutile type titanium oxide using a rotary vacuum polymerization reactor under reduced pressure of 0.5 mmHg at 220° C. for different reaction time to prepare a master batch (MB-IV) containing fine particles of rutile type titanium oxide and having limiting viscosity of 0.70 dL/g and acid value of 19.4 eq/ton.

Manufacture of Cavity-Forming Agent (MB-V)

As a material, 20% by mass of polystyrene (manufactured by Japan PolyStyrene Inc.; G797N) having melt flow rate of 1.5, 20% by mass of polypropylene (manufactured by Idemitsu Kosan Co., Ltd.; F300SP) prepared by a gas-phase polymerization and having melt flow rate of 3.0, and 60% by mass of polymethylpentene (manufactured by Mitsui Chemicals, Inc.; TPX DX-820) having melt flow rate of 180 were subjected to a pellet mixing, supplied to a biaxial extruder and well kneaded to give a cavity-forming agent (MB-V).

Manufacture of Master Batch (MB-VI) Containing Fine Particles

Solid-phase polymerization was conducted from the above master batch (MB-III) pellets containing fine particles of rutile type titanium oxide using a rotary vacuum polymerization reactor under reduced pressure of 0.5 mmHg at 220° C. for different reaction time to prepare a master batch (MB-VI)

containing fine particles of rutile type titanium oxide and having limiting viscosity of 0.80 dL/g and acid value of 17.2 eq/ton.

Example A1

Preparation of Film

A mixture of 65% by mass of polyethylene terephthalate resin (PET-II) and 35% by mass of the previously-prepared MB-II was used as a material for a layer A while a mixture of 85% by mass of PET-II, 7% by mass of MB-II and 8% by mass of MB-V was used as a material for a layer B. Each of them was poured into separate extruder, mixed and melted at 285° C. and conjugated in a melted state so as to give A/B/A layers by using a feed-block. At that time, the rate of extruding amounts for the layer A to the layer B was controlled using a gear pump. After that, the above was extruded using a T-die onto a cooling drum adjusted to 30° C. whereupon a non-stretched sheet was prepared.

(Preparation of Biaxially Stretched Film)

The resulting non-stretched sheet was uniformly heated at 75° C. using a heating roll and subjected to a roll stretch of 3.3 times by heating at 100° C. using a non-contacting heater. The resulting uniaxially stretched film was introduced to a tenter, subjected to a transverse stretch of 4.0 times by heating at 140° C., subjected to a heating treatment at 215° C. for 5 seconds by fixing its width and further subjected to a 4% relaxation treatment at 210° C. in a widthwise direction. Both ends were trimmed, the resulting one was wound using a winding apparatus and slit by dividing into equal two parts in a widthwise direction to give a polyester film for sealing the backside of solar cell having 1300 mm width, 3000 m length and 50 μm thickness (A/B/A=3/44/3 μm).

Example A2

The same method as in Example A1 was conducted except that the extruded amount and the speed were adjusted whereupon a polyester film for sealing the backside of solar cell having 125 μm thickness (8/109/8 μm) was prepared.

Example A3

The same method as in Example A1 was conducted except that the extruded amount and the speed were adjusted whereupon a polyester film for sealing the backside of solar cell having 188 μm thickness (11/166/11 μm) was prepared.

Example A4

The same method as in Example A1 was conducted except that the resulting non-stretched film was uniformly heated at 75° C. using a heating roll followed by heating at 100° C. using a non-contacting heater to conduct a roll stretch of 3.5-times whereupon a polyester film for sealing the backside of solar cell having 50 μm thickness was prepared.

Example A5

The same method as in Example A1 was conducted except that, in order to form a layer B, PET-II was mixed with 5% by mass of polymethylpentene (manufactured by Mitsui Chemicals, Inc.; TPX; DX820) and 10% by mass of a copolymerized PET containing 10% by mass of polyethylene glycol having 4,000 molecular weight as a dispersing agent whereupon a polyester film for sealing the backside of solar cell having 50 μm thickness was prepared.

Example A6

The film roll prepared in Example A1 was passed through an off-line coater set at the temperature of 160° C. and subjected to a relaxation treatment by adjusting the speed and the tension whereupon a polyester film for sealing the backside of solar cell having 50 μm thickness was prepared.

Example A7

The same operation as in Example A1 was conducted except that a mixture of 65% by mass of polyethylene terephthalate resin (PET-V) with 35% by mass of MB-IV was used as a material for the layer A and that a mixture of 85% by mass of PET-V, 7% by mass of MB-IV and 8% by mass of MB-V was used as a material for the layer B whereupon a polyester film for sealing the backside of solar cell having 50 μm thickness was prepared.

Example A8

Compounding of Applying Solution (Polymerization of Urethane Resin Solution I where Aliphatic Polycarbonate Polyol is Constituting Component)

4,4-Diphenylmethane diisocyanate (43.75 parts by mass), 12.85 parts by mass of dimethylolbutanoic acid, 153.41 parts by mass of polyhexamethylenecarbonate diol of 2000 number-average molecular weight, 0.03 part by mass of dibutyl tin dilaurate and 84.00 parts by mass of acetone (as a solvent) were poured into a container and stirred at 75° C. for 3 hours in a nitrogen atmosphere, temperature of the resulting reaction solution was lowered to 40° C. and 8.77 parts by mass of triethylamine was added thereto whereupon a polyurethane prepolymer solution was prepared. Water (450 g) was added thereto, the mixture was adjusted to 25° C. and, with stirring/mixing at 2000 min$^{-1}$, the polyurethane prepolymer solution was added thereto so that it was dispersed in water. After that, a part of water and acetone were removed in vacuo to prepare a water-soluble polyurethane resin solution I containing 35% of solid. Glass transition temperature of the resulting polyurethane resin I was −30° C.

(Preparation of Applying Solution)

The following applying agents were mixed to prepare an applying solution.

| | |
|---|---|
| Water | 55.86% by mass |
| Isopropanol | 30.00% by mass |
| Polyurethane resin solution I | 13.52% by mass |
| Particles (silica sol of 40 nm average particle size; solid concentration: 40% by mass) | 0.59% by mass |
| Surfactant (silicone type; solid concentration: 100% by mass) | 0.03% by mass |

The above applying solution was applied by a roll coat method to one side of the uniaxially orientated PET film after a longitudinal stretch in Example A1 and, after that, drying was conducted at 80° C. for 20 seconds. Incidentally, an adjustment was conducted so as to make the applied amount after the final drying (after a biaxial stretch) 0.15 g/m$^2$. After that, stretch was conducted using a tenter by the same method as in Example A1 to give a polyester film for sealing the backside of solar cell having 50 μm thickness.

The resulting film was cut out into a size of 100 mm width×100 mm length while the EVA sheet was cut out into a size of 70 mm width×90 mm length and they were layered in a constitution of [(film (applying layer side)/EVA mentioned below/(applying layer side) film] followed by subjecting to a pressure connection together with heating using a vacuum laminator under the following adhering condition whereupon a sample was prepared. The prepared sample still showed a good adhesive property even after being allowed to stand for 1000 hours in a container of high temperature and high humidity under the atmosphere of 85° C. and 85% RH.

(Adhering Condition)

Apparatus: Vacuum laminator manufactured by NPC, Inc., LM-30×30 type

Pressure: 1 atmospheric pressure

EVA: manufactured by Sanvic, Ultrapearl PV (0.4 μm)

Laminating step: at 100° C. (for 5 minutes in vacuo and for 5 minutes with pressure in vacuo)

Curing step: thermal treatment at 150° C. (at ordinary pressure for 45 minutes)

Example A9

Manufacture of Back Sheet for Solar Cell

A layer constitution of [(polyester film for sealing the backside of solar cell of Example A1)/(polyester film, manufactured by Toyobo; A4300 125 μm)/(polyester film for sealing the backside of solar cell of Example A1)] was adhered by a dry lamination method to give a sheet for sealing the backside of solar cell. When partial discharge voltage of the resulting sheet for sealing the backside of solar cell was measured, it was 1090 V.

(Adhesive for Dry Laminate)

(Takelac A-315 manufactured by Mitsui Chemicals, Inc.)/(Takenate A-10 manufactured by Mitsui Chemicals, Inc.)=9/1 (ratio in terms of solid)

Example A10

The same method as in Example A1 was conducted except that the thickness ratio of (layer A)/(layer B) was changed as shown in the table to give a polyester film for sealing the backside of solar cell having 50 μm thickness.

Example A11

The same method as in Example A1 was conducted except that a mixture of 65% by mass of polyethylene terephthalate resin (PET-VI) and 35% by mass of MB-VI was used as a material for the layer A and that a mixture of 85% by mass of PET-VI, 7% by mass of MB-VI and 8% by mass of MB-V was used as a material for the layer B to give a polyester film for sealing the backside of solar cell having 50 μm thickness.

Example A12

The same method as in Example A1 was conducted except that a mixture of 65% by mass of polyethylene terephthalate resin (PET-VII) and 35% by mass of MB-II was used as a material for the layer A and that a mixture of 85% by mass of PET-VII, 7% by mass of MB-II and 8% by mass of MB-V was used as a material for the layer B to give a polyester film for sealing the backside of solar cell having 50 μm thickness.

Comparative Example A1

The same method as in Example A1 was used for conducting the stretch except that 100% by mass of polyethylene terephthalate resin (PET-II) was used for both layers A and B to give a polyester film for sealing the backside of solar cell having 50 μm thickness.

Comparative Example A2

The same method as in Example A1 was used for conducting the stretch except that a mixture of 65% by mass of polyethylene terephthalate resin (PET-III) and 35% by mass of the previously prepared MB-I was used as a material for the layer A while a mixture of 85% by mass of PET-III, 7% by mass of MB-1 and 8% by mass of MB-V was used as a material for the layer B and that both were poured into different extruders to give a polyester film for sealing the backside of solar cell having 50 μm thickness.

Comparative Example A3

The same method as in Example A1 was used except that a mixture of 65% by mass of polyethylene terephthalate resin (PET-III) and 35% by mass of MB-II was used as a material for the layer A while a mixture of 85% by mass of PET-III, 7% by mass of MB-II and 8% by mass of MB-V was used as a material for the layer B to give a polyester film for sealing the backside of solar cell having 50 μm thickness.

Comparative Example A4

The same method as in Example A1 was used except that a mixture of 65% by mass of polyethylene terephthalate resin (PET-VIII) and 35% by mass of MB-II was used as a material for the layer A while a mixture of 85% by mass of PET-VIII, 7% by mass of MB-II and 8% by mass of MB-V was used as a material for the layer B to give a polyester film for sealing the backside of solar cell having 50 μm thickness.

TABLE 1

| | | Example A1 | Example A2 | Example A3 | Example A4 | Example A5 | Example A6 | Example A7 | Example A8 |
|---|---|---|---|---|---|---|---|---|---|
| material | | | | | | | | | |
| layer A | | | | | | | | | |
| polyester | material name | PET-II | PET-II | PET-II | PET-II | PET-II | PET-II | PET-V | PET-II |
| | limiting viscosity | 0.71 | 0.71 | 0.71 | 0.71 | 0.71 | 0.71 | 0.73 | 0.71 |
| | rate | 65 | 65 | 65 | 65 | 65 | 65 | 65 | 65 |
| Ti-M.B | material name | M.B-II | M.B-II | M.B-II | M.B-II | M.B-II | M.B-II | MB-IV | M.B-II |
| | limiting viscosity | 0.71 | 0.71 | 0.71 | 0.71 | 0.71 | 0.71 | 0.70 | 0.71 |
| | rate | 35 | 35 | 35 | 35 | 35 | 35 | 35 | 35 |

TABLE 1-continued

| | | | | | | | | | |
|---|---|---|---|---|---|---|---|---|---|
| layer B | | | | | | | | | |
| polyester | material name | PET-II | PET-II | PET-II | PET-II | PET-II | PET-II | PET-V | PET-II |
| | limiting viscosity | 0.71 | 0.71 | 0.71 | 0.71 | 0.71 | 0.71 | 0.73 | 0.71 |
| | rate | 85 | 85 | 85 | 85 | 85 | 85 | 85 | 85 |
| fine particles MB | material name | M.B-II | M.B-II | M.B-II | M.B-II | M.B-II | M.B-II | MB-IV | M.B-II |
| | limiting viscosity | 0.71 | 0.71 | 0.71 | 0.71 | 0.71 | 0.71 | 0.70 | 0.71 |
| | rate | 7 | 7 | 7 | 7 | 7 | 7 | 7 | 7 |
| cavity-forming MB | material name | MB-V | MB-V | MB-V | MB-V | MB-V | MB-V | MB-V | MB-V |
| | rate | 8 | 8 | 8 | 8 | 8 | 8 | 8 | 8 |
| film properties | | | | | | | | | |
| layering thickness (A/B/A) | μm | 3/44/3 | 8/109/8 | 11/166/11 | 3/44/3 | 3/44/3 | 3/44/3 | 3/44/3 | 3/44/3 |
| limiting viscosity | dL/g | 0.7 | 0.7 | 0.7 | 0.7 | 0.7 | 0.7 | 0.7 | 0.7 |
| apparent specific gravity | g/cm$^3$ | 1.12 | 1.12 | 1.11 | 1.04 | 0.9 | 1.13 | 1.12 | 1.12 |
| degree of whiteness | — | 94 | 95 | 96 | 94 | 94 | 94 | 94 | 94 |
| acid value | eq/ton | 21 | 22 | 24 | 21 | 23 | 22 | 14 | 21 |
| content of inorganic fine particles | % by mass | 5.2 | 5.3 | 5.1 | 5.2 | 5.2 | 5.2 | 5.2 | 5.2 |
| resistance to hydrolysis retaining rate of elongation | % | 84 | 81 | 79 | 88 | 85 | 85 | 94 | 84 |
| resistance to light retaining rate of elongation | % | 61 | 80 | 95 | 61 | 62 | 60 | 62 | 61 |
| layered numbers of the cavities | numbers | 14 | 37 | 51 | 16 | 20 | 14 | 14 | 14 |
| void layering density | numbers/μm | 0.28 | 0.3 | 0.27 | 0.32 | 0.4 | 0.28 | 0.28 | 0.28 |
| MD HS150 | % | 2.5 | 2.4 | 2.3 | 2.6 | 2.4 | 0.4 | 2.6 | 2.5 |
| MOR-C | — | 1.66 | 1.62 | 1.58 | 1.52 | 1.65 | 1.62 | 1.64 | 1.66 |
| partial discharge voltage | V | 605 | 925 | 1220 | 615 | 620 | 610 | 610 | 605 |
| light reflectance | % | 84 | 86 | 88 | 85 | 87 | 87 | 85 | 84 |
| variation of the light reflectance | % | 2 | 1 | 2 | 2 | 1 | 1 | 3 | 2 |
| DEG | molar % | 1.6 | 1.6 | 1.6 | 1.6 | 1.6 | 1.6 | 1.6 | 1.6 |
| strength of backside | — | ○ | ○ | ○ | ○ | ○ | ○ | ○ | ○ |
| strength upon processing | — | ○ | ○ | ○ | ○ | ○ | ○ | ○ | ○ |
| surface flatness | — | ○ | ○ | ○ | ○ | ○ | ○ | ○ | ○ |

| | | Example A9 | Example A10 | Example A11 | Example A12 | Comparative Example A1 | Comparative Example A2 | Comparative Example A3 | Comparative Example A4 |
|---|---|---|---|---|---|---|---|---|---|
| material | | | | | | | | | |
| layer A | | | | | | | | | |
| polyester | material name | PET-II | — | PET-VI | PET-VII | PET-II | PET-III | PET-III | PET-VIII |
| | limiting viscosity | 0.71 | — | 0.79 | 0.69 | 0.71 | 0.51 | 0.51 | 1.01 |
| | rate | 65 | — | 65 | 65 | 100 | 65 | 65 | 65 |
| Ti-M.B | material name | M.B-II | — | MB-VI | MB-II | — | M.B-I | MB-II | MB-II |
| | limiting viscosity | 0.71 | — | 0.80 | 0.71 | — | 0.45 | 0.71 | 0.71 |
| | rate | 35 | — | 35 | 35 | — | 35 | 35 | 35 |
| layer B | | | | | | | | | |
| polyester | material name | PET-II | PET-II | PET-VI | PET-VIII | PET-II | PET-III | PET-III | PET-VIII |
| | limiting viscosity | 0.71 | 0.71 | 0.79 | 0.69 | 0.71 | 0.51 | 0.51 | 1.01 |
| | rate | 85 | 85 | 85 | 85 | 100 | 85 | 85 | 85 |
| fine particles MB | material name | M.B-II | M.B-II | MB-VI | MB-II | — | M.B-I | MB-II | MB-II |
| | limiting viscosity | 0.71 | 0.71 | 0.80 | 0.71 | — | 0.45 | 0.71 | 0.71 |
| | rate | 7 | 7 | 7 | 7 | — | 7 | 7 | 7 |
| cavity-forming MB | material name | MB-V | MB-V | MB-V | MB-V | — | MB-V | MB-V | MB-V |
| | rate | 8 | 8 | 8 | 8 | — | 8 | 8 | 8 |
| film properties | | | | | | | | | |
| layering thickness (A/B/A) | μm | 3/44/3 | 0/50/0 | 3/44/3 | 3/44/3 | 3/44/3 | 3/44/3 | 3/44/3 | 3/44/3 |
| limiting viscosity | dL/g | 0.7 | 0.7 | 0.76 | 0.66 | 0.71 | 0.47 | 0.51 | 0.85 |
| apparent specific gravity | g/cm$^3$ | 1.12 | 1 | 1.12 | 1.12 | 1.4 | 1.09 | 1.19 | 1.13 |
| degree of whiteness | — | 94 | 88 | 94 | 94 | — | 93 | 93 | 92 |
| acid value | eq/ton | 21 | 20 | 19 | 22 | 6 | 51 | 48 | 19 |
| content of inorganic fine particles | % by mass | 5.2 | 3.5 | 5.2 | 5.2 | 0 | 5.2 | 5.2 | 5.2 |
| resistance to hydrolysis retaining rate of elongation | % | 84 | 82 | 86 | 79 | 81 | 13 | 17 | 87 |

TABLE 1-continued

| | | | | | | | | | |
|---|---|---|---|---|---|---|---|---|---|
| resistance to light retaining rate of elongation | % | 61 | 52 | 61 | 61 | 20 | 62 | 60 | 61 |
| layered numbers of the cavities | numbers | 14 | 17 | 14 | 14 | 0 | 16 | 15 | 16 |
| void layering density | numbers/μm | 0.28 | 0.34 | 0.28 | 0.28 | 0 | 0.32 | 0.3 | 0.32 |
| MD HS150 | % | 2.5 | 2.1 | 2.5 | 2.5 | 2.5 | 2.3 | 2 | 2.5 |
| MOR-C | — | 1.66 | 1.54 | 1.66 | 1.66 | 1.66 | 1.51 | 1.5 | 1.6 |
| partial discharge voltage | V | 605 | 650 | 605 | 605 | 490 | 620 | 610 | 620 |
| light reflectance | % | 83 | 80 | 84 | 85 | 12 | 75 | 78 | 80 |
| variation of the light reflectance | % | 1 | 3 | 4 | 2 | — | 4 | 8 | 9 |
| DEG | molar % | 1.6 | 1.6 | 1.6 | 1.6 | 1.6 | 1.6 | 1.6 | 1.6 |
| strength of backside | — | ○ | x | ○ | ○ | ○ | ○ | ○ | ○ |
| strength upon processing | — | ○ | ○ | ○ | ○ | ○ | ○ | ○ | ○ |
| surface flatness | — | ○ | ○ | ○ | ○ | ○ | ○ | ○ | ○ |

Example B1

Preparation of Film

A mixture of 60% by mass of polyethylene terephthalate resin (PET-II) and 40% by mass of the previously-prepared MB-II was used as materials for a layer A and a layer B. Each of them was poured into separate extruder, mixed and melted at 285° C. and conjugated in a melted state so as to give A/B layers by using a feed-block. At that time, the rate of extruding amounts for the layer A to the layer B was controlled using a gear pump. After that, the above was extruded using a T-die onto a cooling drum adjusted to 30° C. whereupon a non-stretched sheet was prepared.

(Preparation of Biaxially Stretched Film)

The resulting non-stretched sheet was uniformly heated at 75° C. using a heating roll and subjected to a roll stretch of 3.3 times by heating at 100° C. using a non-contacting heater. The resulting uniaxially stretched film was introduced to a tenter, subjected to a transverse stretch of 4.0 times by heating at 140° C., subjected to a heating treatment at 215° C. for 5 seconds by fixing its width and further subjected to a 4% relaxation treatment at 210° C. in a widthwise direction so as to give a substantially single-layered polyester film for sealing the backside of solar cell having 80 μm thickness (A/B=16/64 μm).

Example B2

A mixture of 64% by mass of polyethylene terephthalate resin (PET-II) and 36% by mass of the previously-prepared MB-II was used as a material for a layer A while a mixture of 96% by mass of PET-II and 4% by mass of MB-II was used as a material for a layer B. Each of them was poured into separate extruder, mixed and melted at 285° C. and conjugated in a melted state so as to give A/B layers by using a feed-block. At that time, the rate of extruding amounts for the layer A to the layer B was controlled using a gear pump. After that, the above was extruded using a T-die onto a cooling drum adjusted to 30° C. whereupon a non-stretched sheet was prepared. Preparation of a biaxially stretched film was conducted by the same method as in Example B1 to give a polyester film for sealing the backside of solar cell having 80 μm thickness (A/B=16/64 μm) comprising two kinds in two layers.

Example B3

The same method as in Example B2 was conducted except that PET-II in the layers A and B was changed to PET-V and that MB-II was changed to MB-IV to give a polyester film for sealing the backside of solar cell comprising two kinds in two layers.

Example B4

A mixture of 64% by mass of polyethylene terephthalate resin (PET-II) and 36% by mass of the previously-prepared MB-II was used as materials for a layer A and a layer B while a mixture of 56% by mass of PET-II, 36% by mass of MB-II and 8% by mass of MB-V was used as a material for a layer B. Each of them was poured into separate extruder, mixed and melted at 285° C. and conjugated in a melted state so as to give A/B layers by using a feed-block. At that time, the rate of extruding amounts for the layer A to the layer B was controlled using a gear pump. After that, the above was extruded using a T-die onto a cooling drum adjusted to 30° C. whereupon a non-stretched sheet was prepared. Preparation of a biaxially stretched film was conducted by the same method as in Example B1 to give a polyester film for sealing the backside of solar cell having 50 μm thickness (A/B=10/40 μm) comprising two kinds in two layers.

Example B5

The same method as in Example B4 was conducted except that PET-II in the layers A and B was changed to PET-V and that MB-II was changed to MB-IV to give a polyester film for sealing the backside of solar cell comprising two kinds in two layers.

Example B6

Manufacture of Master Batch Containing Fine Particles

As a material, a mixture of 50% by mass of a polyethylene terephthalate resin previously dried at 120° C. in $10^{-3}$ torr for about 8 hours with 50% by mass of rutile-type titanium dioxide having an average particle size of 0.3 μm (according to an electron microscopic method) was supplied to a biaxial vent-type extruder, kneaded for 20 minutes, continuously sucked at 0.1 MPa and extruded at 275° C. together with deaeration to prepare master bath (MB-VII) pellets containing fine particles of rutile-type titanium dioxide. Limiting viscosity of the MB-VII was 0.48 dL/g. Acid value of the MB-VII was 39.8 eq/ton.

Further, solid-phase polymerization was conducted from the MB-VII pellets in vacuo (10 Pa) until the limiting viscosity reached 0.75 dL/g to prepare a master batch (MB-VIII) containing fine particles of rutile-type titanium dioxide. Acid value of MB-VIII was 10.1 eq/ton.

Manufacture of Polyethylene Terephthalate Resin (PET-IX)

Solid-phase polymerization was conducted from polyethylene terephthalate resin (PET-IV) using a rotary vacuum polymerization reactor under reduced pressure of 0.5 mmHg at 220° C. for different reaction time to prepare a polyethylene terephthalate resin (PET-IX) having limiting viscosity of 0.75 dL/g and acid value of 5.0 eq/ton.

(Preparation of Film)

Then, a mixture of 80% by mass of PET-IX and 20% by mass of the previously-prepared MB-VIII was used as a material for a layer A while a mixture of 80% by mass of PET-IX, 12% by mass of MB-VIII and 8% by mass of MB-V was used as a material for a layer B. Each of them was poured into separate extruder, mixed and melted at 280° C. and the layer B was conjugated to one side of the layer A in a melted state by using a feed-block. At that time, the rate of extruding amounts for the layer A to the layer B was controlled using a gear pump. After that, the above was extruded using a T-die onto a cooling drum adjusted to 30° C. whereupon a non-stretched sheet was prepared so as to give A/B/A layers.

(Preparation of Biaxially Stretched Film)

The resulting non-stretched sheet was uniformly heated at 70° C. using a heating roll and subjected to a roll stretch of 3.3 times at 90° C. The resulting uniaxially stretched film was introduced to a tenter, subjected to a transverse stretch of 3.7 times by heating at 140° C., subjected to a heating treatment at 220° C. for 5 seconds by fixing its width and further subjected to a 4% relaxation treatment at 220° C. in a widthwise direction. Both ends were trimmed, the resulting one was wound using a winding apparatus and slit by dividing into equal two parts in a widthwise direction to give a roll of polyester film for sealing the backside of solar cell having 1300 mm width, 3000 m length and 188 μm thickness (19/150/19).

TABLE 2

| | | | Example B1 | Example B2 | Example B3 | Example B4 | Example B5 | Example B6 |
|---|---|---|---|---|---|---|---|---|
| material | | | | | | | | |
| layer A | | | | | | | | |
| polyester | | material name | PET-II | PET-II | PET-V | PET-II | PET-V | PET-IX |
| | | limiting viscosity | 0.71 | 0.71 | 0.73 | 0.71 | 0.73 | 0.75 |
| | | rate | 60 | 64 | 64 | 64 | 50 | 80 |
| Ti-M.B | | material name | M.B-II | M.B-II | M.B-IV | M.B-II | M.B-IV | M.B-VIII |
| | | limiting viscosity | 0.71 | 0.71 | 0.7 | 0.71 | 0.7 | 0.75 |
| | | rate | 40 | 36 | 36 | 36 | 50 | 20 |
| layer B | | | | | | | | |
| polyester | | material name | PET-II | PET-II | PET-V | PET-II | PET-V | PET-IX |
| | | limiting viscosity | 0.71 | 0.71 | 0.73 | 0.71 | 0.73 | 0.75 |
| | | rate | 60 | 96 | 96 | 56 | 56 | 80 |
| fine particles MB | | material name | M.B-II | M.B-II | M.B-IV | M.B-II | M.B-IV | M.B-VIII |
| | | limiting viscosity | 0.71 | 0.71 | 0.7 | 0.71 | 0.7 | 0.75 |
| | | rate | 40 | 4 | 4 | 36 | 36 | 12 |
| cavity-forming MB | | material name | | | | MB-V | MB-V | MB-V |
| | | rate | | | | 8 | 8 | 8 |
| film properties | | | | | | | | |
| layering thickness (A/B/A) | | μm | 16/64/— | 16/64 | 16/64 | 10/40/— | 10/40/— | 19/150/19 |
| limiting viscosity | | dL/g | 0.65 | 0.68 | 0.71 | 0.68 | 0.7 | 0.78 |
| apparent specific gravity | | g/cm$^3$ | 1.42 | 1.41 | 1.41 | 1.15 | 1.12 | 1.07 |
| degree of whiteness | | — | 90 | 91 | 91 | 93 | 94 | 93 |
| acid value | | eq/ton | 29 | 21 | 17 | 25 | 21 | 6.9 |
| content of inorganic fine particles | | % by mass | 20 | 5.2 | 5.2 | 18 | 18 | 6.8 |
| resistance to hydrolysis retaining rate of elongation | | % | 74 | 88 | 92 | 76 | 86 | 92 |
| resistance to light retaining rate of elongation | | % | 78 | 66 | 66 | 76 | 76 | 40 |
| layered numbers of the cavities | | numbers | — | — | — | 50 | 50 | 52 |
| void layering density | | numbers/μm | — | — | — | 0.25 | 0.25 | 0.28 |
| MD HS150 | | % | 2.4 | 2.3 | 2.4 | 2.4 | 2.3 | 2.1 |
| MOR-C | | — | 1.67 | 1.6 | 1.58 | 1.58 | 1.52 | 1.57 |
| partial discharge voltage | | V | 580 | 578 | 580 | 630 | 620 | 1240 |
| light reflectance | | % | 75 | 72 | 71 | 82 | 83 | 88 |
| variation of the light reflectance | | % | 2 | 2 | 1 | 2 | 2 | 1 |
| DEG | | molar % | 1.5 | 1.6 | 1.6 | 1.6 | 1.6 | 1.6 |
| strength of backside | | — | ○ | ○ | ○ | ○ | ○ | ○ |
| strength upon processing | | — | ○ | ○ | ○ | ○ | ○ | ○ |
| surface flatness | | — | ○ | ○ | ○ | ○ | ○ | ○ |

INDUSTRIAL APPLICABILITY

The polyester film for sealing the backside of solar cell according to the present invention is excellent in light reflectivity and durability and is also excellent in electric insulation whereby it is useful as a sheet for protective sealing of the backside of solar cell.

The invention claimed is:

1. A polyester film for sealing a backside of a solar cell, wherein the polyester film has a light reflectance at 550 nm wavelength of 50% or more,
   contains 3 to 50% by mass of inorganic fine particles,
   has an acid value of 1 to 30 eq/ton,
   has an in-face variation of light reflectance to a mean value of light reflectance of 5% or less, and
   has a limiting viscosity of 0.60 to 0.80 dL/g,
   wherein the film is obtained by preparing a master batch comprising a polyester resin and inorganic fine particles; subjecting the master batch to solid-phase polymerization; and, after that, forming a mixture by pouring a polyester resin containing no inorganic fine particles and the master batch into an extruder and melt extruding the mixture, wherein a difference between a limiting viscosity of the master batch and a limiting viscosity of the polyester resin to be mixed therewith is 0.15 dL/g or less.

2. The polyester film for sealing the backside of a solar cell according to claim 1, wherein the inorganic fine particles are titanium oxide of a rutile type.

3. The polyester film for sealing the backside of a solar cell according to claim 1, wherein the polyester film has a thickness of 30 to 300 μm.

4. The polyester film for sealing the backside of a solar cell according to claim 1, wherein the polyester film has a partial discharge voltage of 550 V or higher.

5. The polyester film for sealing the backside of a solar cell according to claim 1, wherein 5 or more cavities exist in a thickness direction of the film and cavities defined by the following formula have a density within a range of 0.1 to 7 μm:

$$\text{Density of layered numbers of cavities(numbers/μm)} = \frac{[\text{Layered numbers of cavities in the thickness direction of film(numbers)}]}{[\text{Thickness of film (μm)}]}.$$

6. The polyester film for sealing the backside of a solar cell according to claim 1, wherein an applied layer is provided at least on one side of the film, wherein a urethane resin is a main component of the applied layer, and wherein an aliphatic polycarbonate polyol is a constituting component of the urethane resin.

7. The polyester film for sealing the backside of a solar cell according to claim 1, wherein the film is used on a face of a side contacting an encapsulation foil for a solar cell module and/or on an outermost face of a solar cell module.

8. A solar cell module containing the polyester film for sealing the backside of a solar cell according to claim 1, wherein an encapsulation layer is adjacent to the polyester film and a solar cell device is embedded in the encapsulation layer.

9. The polyester film for sealing the backside of a solar cell according to claim 1, wherein
   the inorganic fine particles are titanium dioxide of a rutile type,
   the polyester film has a thickness of 30 to 300 μm, and
   the polyester film has a partial discharge voltage of 550 V or higher.

10. The polyester film for sealing the backside of a solar cell according to claim 9, wherein 5 or more cavities exist in a thickness direction of the film and cavities defined by the following formula have a density within a range of 0.1 to 7/μm:

$$\text{Density of layered numbers of cavities(numbers/μm)} = \frac{[\text{Layered numbers of cavities in the thickness direction of film(numbers)}]}{[\text{Thickness of film (μm)}]}.$$

11. A solar cell module containing the polyester film for sealing the backside of a solar cell according to claim 10, wherein an encapsulation layer is adjacent to the polyester film and a solar cell device is embedded in the encapsulation layer.

12. The polyester film for sealing the backside of a solar cell according to claim 10, wherein an applied layer is provided at least on one side of the film, wherein a urethane resin is a main component of the applied layer, and wherein an aliphatic polycarbonate polyol is a constituting component of the urethane resin.

13. A solar cell module containing the polyester film for sealing the backside of a solar cell according to claim 12, wherein an encapsulation layer is adjacent to the polyester film and a solar cell device is embedded in the encapsulation layer.

14. A solar cell module containing the polyester film for sealing the backside of a solar cell according to claim 9, wherein an encapsulation layer is adjacent to the polyester film and a solar cell device is embedded in the encapsulation layer.

* * * * *